United States Patent [19]

Hosoi et al.

[11] Patent Number: 4,803,359

[45] Date of Patent: Feb. 7, 1989

[54] METHOD FOR DETECTING RADIATION IMAGE

[75] Inventors: Yuichi Hosoi; Junji Miyahara, both of Kaisei, Japan

[73] Assignee: Fuji Photo Film Co., Ltd., Minami-ashigara, Japan

[21] Appl. No.: 610,582

[22] Filed: May 15, 1984

[30] Foreign Application Priority Data

May 16, 1983 [JP] Japan .................................. 58-86226
May 16, 1983 [JP] Japan .................................. 58-86227

[51] Int. Cl.$^4$ .............................................. G03C 5/16
[52] U.S. Cl. ................................. 250/327.2; 250/484.1
[58] Field of Search ............... 250/366, 484.1, 327.2, 250/370, 483.1; 357/41; 378/99

[56] References Cited

U.S. PATENT DOCUMENTS

| | | | |
|---|---|---|---|
| 4,148,048 | 4/1979 | Takemoto et al. | 357/30 |
| 4,284,889 | 8/1981 | Kato et al. | 250/337 |
| 4,288,264 | 9/1981 | Haque | 250/370 |
| 4,320,296 | 3/1982 | Ishida et al. | 250/327.2 |
| 4,631,407 | 12/1986 | Kawajiri et al. | 250/327.2 |

FOREIGN PATENT DOCUMENTS 215575 12/1983 Japan .................................. 250/327.2

OTHER PUBLICATIONS

Keller, "Storage Device Using Phosphors", IBM Tech. Discl. Bull., 1(1), Jun. 1958, p. 38.

Primary Examiner—Carolyn E. Fields
Attorney, Agent, or Firm—Gerald J. Ferguson, Jr.

[57] ABSTRACT

A method for detecting radiation image which comprises steps of: causing a radiation image storage panel which comprises a phosphor layer containing a stimulable phosphor to absorb a radiation having passed through an object or radiated from an object; placing said radiation image storage panel and a photosensor composed of numerous photosensitive elements in regular and two-dimensional arrangement together in layers, and irradiating the panel with an electromagnetic wave to release the radiation energy stored in the panel as stimulated emission; and photoelectrically detecting the stimulated emission with said photosensor. A method for detecting radiation image using a radiation image detector which comprises a photosensitive member composed of numerous photosensitive elements and a phosphor layer containing a stimulable phosphor provided thereon is also disclosed.

7 Claims, 2 Drawing Sheets

METHOD FOR DETECTING RADIATION IMAGE

BACKGROUND OF THE INVENTION

1. Field of the Invention

The present invenion relates to a method for detecting radiation image. More particularly, the present invention relates to a method for detecting radiation image employing a combination of a stimulabale phosphor and photosensitive elements.

2. Description of Prior Art

For obtaining a radiation image, there has been conventionally employed a radiography utilizing a combination of a radiographic film having an emulsion layer containing a photosensitive silver salt material and an intensifying screen.

As a method replacing the above-described radiography, a radiation image recording and reproducing method utilizing a stimulable phosphor as described, for example, in U.S. Pat. No. 4,239,968, has been recently paid much attention. The radiation image recording and reproducing method involves steps of causing a stimulable phosphor to absorb radiation energy having passed through an object or having radiated from an object; exciting the stimulable phosphor with an electromagnetic wave such as visible light or infrared rays (hereinafter referred to as "stimulating rays") to sequentially release the radiation energy stored in the stimulable phosphor as light emission (stimulated emission); photoelectrically detecting the emitted light to obtain an electric signal.

Heretofore, it has been proposed in the radiation image recording and reproducing method to detect a radiation image by using a radiation image storage panel (i.e., a stimulable phosphor sheet) containing a stimulable phosphor and photoelectrically reading out radiation energy stored in the panel with a read-out system. The radiation image storage panel employed in the method has a basic structure comprising a support and a phosphor layer provided on one surface of the support. Further, a transparent film is generally provided on the free surface (surface not facing the support) of the phosphor layer to keep the phosphor layer from chemical deterioration or physical shock.

In the read-out system, a photomultiplier is usually employed as a photosensor as disclosed in Japanese Patent Provisional Publication No. 56(1981)-11395, and on the light-receiving face of the photomultiplier a light guiding sheet for receiving the emission from the surface of the radiation image storage panel and guiding it to the photosensor is provided.

More in detail, a radiation which passed through an object or radiated from an object is absorbed by the phosphor layer of the radiation image storage panel, and a radiation image of the object is formed on the panel as a radiation energy-stored image. Subsequently, the panel carrying the energy-stored image is excited with an electromagnetic wave (stimulating rays) such as visible light or infrared rays in the image read-out system, to release the energy-stored image as light emission (stimulated emission). The stimulated emission is guided in the interior of the light guiding sheet and then photoelectrically detected with the photomultiplier to give an electric signal. The radiation image of the object is then reproduced from the electric signal.

In the above-described radiation image recording and reproducing method, a radiation image can be obtained with a sufficient amount of information by applying a radiation to an object at considerably smaller dose, as compared with the case of using the conventional radiography. Accordingly, this radiation image recording and reproducing method is of great value especially when the method is used for medical diagnosis.

Nevertheless, the above-mentioned radiation image recording and reproducing method has some problems. In the read-out operation, the radiation image storage panel is sequentially irradiated with a light beam (i.e., stimulating rays) having a small beam diameter such as a laser beam, namely, scanned with laser (main-scanning or sub-scanning), and the light emitted from the panel under the scanning is detected with a photosensor such as a photomultiplier to be converted to an electric signal. This read-out operation requires not a short period of time (several ten seconds). In order to detect the light which is sequentially emitted by each phosphor particle in the radiation image storage panel irradiated with the stimulating rays, the panel is usually transferred under the irradiation of stimulating rays (sub-scanning or main-scanning). Consequently, the detecting operation (read-out operation) of the radiation image recorded on the radiation image storage panel is complicated.

Further, in the case that a light guiding sheet is used in combination with the photomultiplier to efficiently detect the light emitted from the radiation image storage panel, the read-out system becomes more complicated and accordingly the operation sometimes encounters certain troubles.

SUMMARY OF THE INVENTION

A primary object of the present invention is to provide a method for detecting radiation image which is free from or reduced in the above-mentioned problems attached to the conventional radiation image recording and reproducing method utilizing the stimulable phosphor.

The object can be accomplished by the method for detecting radiation image of the present invention which comprises steps of:

causing a radiation image storage panel which comprises a phosphor layer containing a stimulable phosphor to absorb a radiation having passed through an object or radiated from an object;

placing said radiation image storage panel and a photosensor composed of numerous photosensitive elements in regular and two-dimensional arrangement together in layers, and irradiating the panel with an electromagnetic wave to release the radiation energy stored in the panel as stimulated emission; and photoelectrically detecting the stimulated emission with said photosensor.

The object is also accomplished by the method for detecting radiation image of the present invention which comprises steps of:

causing a phosphor layer of a radiation image detector to absorb a radiation having passed through an object or radiated from an object, said radiation image detector comprising a photosensitive member composed of numerous photosensitive elements in regular and two-dimensional arrangement and the phosphor layer containing a stimulable phosphor provided thereon;

irradiating said phosphor layer with an electromagnetic wave to release the radiation energy stored in said phosphor layer as stimulated emission; and photoelectrically detecting the stimulated emission with said photosensitive member.

DETAILED DESCRIPTION OF THE INVENTION

Figure 1A:
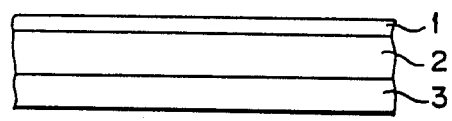
FIGS. 1-(a) and 1-(b) are schematic partial section views which show embodiments of the radiation image storage panel and photosensor according to the present invention, respectively.

As results of investigation, the present inventors have discovered that the image information concerning the radiation image of an object can be directly obtained as an electric signal by using the photosensor composed of numerous photosensitive elements and by causing a stimulable phosphor in the radiation image storage panel to absorb a radiation such as X-rays having passed through the object or radiated from the object, irradiating the panel combined with the photosensor in layers, with an electromagnetic wave in the stimulation wavelength region for the stimulable phosphor to cause the panel to release stimulated emission, and causing the photosensitive elements of the photosensor to receive the stimulated emission and to convert it to an electric signal.

The present inventors further have discovered that the image information concerning the radiation image of an object can be directly obtained as an electric signal by using the radiation image detector which has a photosensitive member composed of numerous photosensitive elements and a phosphor layer comprising a stimulable phosphor provided thereon, and by causing the phosphor layer to absorb a radiation having passed through the object or radiated from the object, irradiating the phosphor layer with the electromagnetic wave to cause the phosphor layer to release stimulated emission, and causing the photosensitive elements of the photosensitive member to receive the stimulated emission and to convert it to an electric signal.

In the present invention, the photosensitive elements are used as photosensors (or photosensitive members), being independent of the radiation image storage panel (or integrated with the phosphor layer), so that the radiation image can be obtained as the electric signal given by each photosensitive element under the irradiation of stimulating rays and consequently the detection period of the radiation image can be remarkably reduced compared with the conventionally proposed method for detecting the radiation image.

Further, the photosensor used in the former method of the present invention comprises a great number of photosensitive elements which are arranged regularly and two-dimensionally to have the same size as that of the radiation image storage panel, and the read-out operation of the panel is conducted under the condition in which the photosensor is superposed on the panel. The stimulated emission released from the surface of the panel under the irradiation of stimulating rays is detected by each photosensitive element provided adjacent to the panel, so that the requirement of the transfer of panel is eliminated in the read-out operation and accordingly the detection of the radiation image is simplified.

Otherwise, in the radiation image detector used in the latter method of the present invention, a great number of photosensitive elements are so provided in regular and two-dimensional arrangement as to cover one surface of a phosphor layer, and the stimulated emission from the surface of the phosphor layer under the irradiation of stimulating rays is detected by each photosensitive element provided adjacent to the phosphor layer. Thus, the detection of the radiation image can be conducted entirely in a solid-state system so that the requirement of the transfer of panel is eliminated in the read-out operation and accordingly the detection of the radiation image is simplified.

Furthermore, it is not necessary to use the light guiding sheet for collecting the emission released from the surface of the panel, which is required in the conventional method. Accordingly, the read-out system can be made more compact, and the adverse effect on the quality of the image given by the mechanical transfer of panel or detector in the read-out operation as described above can be eliminated. This means that the radiation image is detected with a high accuracy, even if the intensity of the radiation which passed through the object or released from the object is low. For example, the method of the present invention is effectively applicable to autoradiography.

One embodiment of the detecting system employed in the method for detecting a radiation image of the present invention, namely, the combination of the photosensor and radiation image storage panel, will be described in detail hereinafter.

The photosensor employed in the present invention comprises numerous photosensitive elements in regular and two-dimensional arrangement, that is, they are arranged regularly and horizontally to form a plane. Each photosensitive element comprises a light receiving section to receive the light emitted by the phosphor layer and a transferring section to sequentially output an electric charge obtained through the photoelectrical conversion at the light receiving section as an electric signal. As the photosensitive element, a known solid-state imaging device using an amorphous semiconductor or the like can be employed.

Examples of such solid-state imaging device include sensors such as MOS (Metal Oxide Semiconductor), CCD (Charged Coupled Device), BBD (Bucket Brigade Device), and CID (Charged Isolated Device). Examples of photoconductive material employed for the solid-state imaging devices include amorphous silicon ($\alpha$-Si), ZnO, and CdS.

On the side of the photosensor which is adjacent to a radiation image storage panel is provided an insulating layer. Examples of the material of the insulating layer include light-transmissive insulating materials such as glass and transparent polymeric material. The insulating layer is desired to have such a filter function that it allows only the light in the wavelength region of the stimulated emission to pass through and cuts off the light in the wavelength region of the stimulating rays. Such function as an optical filter is provided on the insulating layer, for instance, by coloring the insulating layer with a colorant having the light selectivity (light absorption characteristics) as mentioned above.

Otherwise, a filter layer having the above-mentioned light characteristics may be provided on the insulating layer.

The radiation image storage panel employed in the present invention basically comprises a support and a phosphor layer provided thereon. In the case that the phosphor layer is self-supporting, the radiation image storage panel comprises only a phosphor layer.

The support allowing transmission of the stimulating rays is employed in the radiation image storage panel. A material of the support can be selected from those used in the conventional radiographic intensifying screens. Examples of the support material include plastic films such as films of cellulose acetate, polyester and polyethylene terephthalate.

The phosphor layer comprises a binder and stimulable phosphor particles dispersed therein. The stimulable phosphor, as described hereinbefore, give stimulated emission when excited with stimulating rays after exposure to a radiation. From the viewpoint of practical use, the stimulable phosphor is desired to give stimulated emission in the wavelength region of 300–500 nm when excited with stimulating rays in the wavelength region of 400–850 nm.

Examples of the stimulable phosphor employable in the radiation image storage panel of the present invention include:

SrS:Ce,Sm, SrS:Eu,Sm, ThO$_2$:Er, and La$_2$O$_2$S:Eu,Sm, as described in U.S. Pat. No. 3,859,527;

ZnS:Cu,Pb, BaO.xAl$_2$O$_3$:Eu, in which x is a number satisfying the condition of $0.8 \leq x \leq 10$, and M$^{2+}$O.xSiO$_2$:A, in which M$^{2+}$ is at least one divalent metal selected from the group consisting of Mg, Ca, Sr, Zn, Cd and Ba, A is at least one element selected from the group consisting of Ce, Tb, Eu, Tm, Pb, Tl, Bi and Mn, and x is a number satisfying the condition of $0.5 \leq x \leq 2.5$, as described in U.S. Pat. No. 4,326,078;

(Ba$_{1-x-y}$,Mg$_x$,Ca$_y$)FX:aEu$^{2+}$, in which X is at least one element selected from the group consisting of Cl and Br, x and y are numbers satisfying the conditions of $0 < x+y \leq 0.6$, and $xy \neq 0$, and a is a number satisfying the condition of $10^{-6} \leq a \leq 5 \times 10^{-2}$, as described in Japanese Patent Provisional Publication No. 55(1980)-12143, which corresponds to U.S. patent application Ser. No. 570,080, now abandoned;

LnOX:xA, in which Ln is at least one element selected from the group consisting of La, Y, Gd and Lu, X is at least one element selected from the group consisting of Cl and Br, A is at least one element selected from the group consisting of Ce and Tb, and x is a number satisfying the condition of $0 < x < 0.1$, as described in the above-mentioned U.S. Pat. No. 4,326,078;

(Ba$_{1-x}$,M$^{II}_x$)FX:yA, in which M$^{II}$ is at least one divalent metal selected from the group consisting of Mg, Ca, Sr, Zn and Cd, X is at least one element selected from the group consisting of Cl, Br and I, A is at least one element selected from the group consisting of Eu, Tb, Ce, Tm, Dy, Pr, Ho, Nd, Yb and Er, and x and y are numbers satisfying the conditions of $0 \leq x \leq 0.6$ and $0 \leq y \leq 0.2$, respectively, as described in Japanese Patent Provisional Publication No. 55(1980)-12145;

M$^{II}$FX.xA:yLn, in which M$^{II}$ is at least one element selected from the group consisting of Ba, Ca, Sr, Mg, Zn and Cd; A is at least one compound selected from the group consisting of BeO, MgO, CaO, SrO, BaO, ZnO, Al$_2$O$_3$, Y$_2$O$_3$, La$_2$O$_3$, In$_2$O$_3$, SiO$_2$, TiO$_2$, ZrO$_2$, GeO$_2$, SnO$_2$, Nb$_2$O$_5$, Ta$_2$O$_5$ and ThO$_2$; Ln is at least one element selected from the group consisting of Eu, Tb, Ce, Tm, Dy, Pr, Ho, Nd, Yb, Er, Sm and Gd; X is at least one element selected from the group consisting of Cl, Br and I; and x and y are numbers satisfying the conditions of $5 \times 10^{-5} \leq x \leq 0.5$ and $0 < y \leq 0.2$, respectively, as described in Japanese Patent Provisional Publication No. 55(1980)-160078;

(Ba$_{1-x}$,M$^{II}_x$)F$_2$.aBaX$_2$:yEu,zA, in which M$^{II}$ is at least one element selected from the group consisting of Be, Mg, Ca, Sr, Zn and Cd; X is at least one element selected from the group consisting of Cl, Br and I; A is at least one element selected from the group consisting of Zr and Sc; and a, x, y and z are numbers satisfying the conditions of $0.5 \leq a \leq 1.25$, $0 \leq x \leq 1$, $10^{-6} \leq y \leq 2 \times 10^{-1}$, and $0 < z \leq 10^{-2}$, respectively, as described in Japanese Patent Provisional Publication No. 56(1981)116777;

(Ba$_{1-x}$,M$^{II}_x$)F$_2$.aBaX$_2$:yEu,zB, in which M$^{II}$ is at least one element selected from the group consisting of Be, Mg, Ca, Sr, Zn and Cd; X is at least one element selected from the group consisting of Cl, Br and I; and a, x, y and z are numbers satisfying the conditions of $0.5 \leq a \leq 1.25$, $0 \leq x \leq 1$, $10^{-6} \leq y \leq 2 \times 10^{-1}$, and $0 < z \leq 2 \times 10^{-1}$, respectively, as described in Japanese Patent Provisional Publication No. 57(1982)-23673;

(Ba$_{1-x}$,M$^{II}_x$)F$_2$.aBaX$_2$:yEu,zA, in which M$^{II}$ is at least one element selected from the group consisting of Be, Mg, Ca, Sr, Zn and Cd; X is at least one element selected from the group consisting of Cl, Br and I; A is at least one element selected from the group consisting of As and Si; and a, x, y and z are numbers satisfying the conditions of $0.5 \leq a \leq 1.25$, $0 \leq x \leq 1$, $10^{-6} \leq y \leq 2 \times 10^{-1}$, and $0 < z \leq 5 \times 10^{-1}$, respectively, as described in Japanese Patent Provisional Publication No. 57(1982)-23675;

M$^{III}$OX:xCe, in which M$^{III}$ is at least one trivalent metal selected from the group consisting of Pr, Nd, Pm, Sm, Eu, Tb, Dy, Ho, Er, Tm, Yb, and Bi; X is at least one element selected from the group consisting of Cl and Br; and x is a number satisfying the condition of $0 < x < 0.1$, as described in Japanese Patent Provisional Publication No. 58(1983)-69281;

Ba$_{1-x}$M$_{x/2}$L$_{x/2}$FX:yEu$^{2+}$, in which M is at least one alkali metal selected from the group consisting of Li, Na, K, Rb and Cs; L is at least one trivalent metal selected from the group consisting of Sc, Y, La, Ce, Pr, Nd, Pm, Sm, Gd, Tb, Dy, Ho, Er, Tm, Yb, Lu, Al, Ga, In and Tl; X is at least one halogen selected from the group consisting of Cl, Br and I; and x and y are numbers satisfying the conditions of $10^{-2} \leq x \leq 0.5$ and $0 < y \leq 0.1$, respectively, as described in Japanese Patent Provisional Publication No. 58(1983)-206678;

BaFX.xA:yEu$^{2+}$, in which X is at least one halogen selected from the group consisting of Cl, Br and I; A is at least one fired product of a tetrafluoroboric acid compound; and x and y are numbers satisfying the conditions of $10^{-6} \leq x \leq 0.1$ and $0 < y \leq 0.1$, respectively, as described in Japanese Patent Provisional Publication No. 59(1984)-27980;

BaFX.xA:yEu$^{2+}$, in which X is at least one halogen selected from the group consisting of Cl, Br and I; A is at least one fired product of a hexafluoro compound selected from the group consisting of monovalent and divalent metal salts of hexafluoro silicic acid, hexafluoro titanic acid and hexafluoro zirconic acid; and x and y are numbers satisfying the conditions of $10^{-6} \leq x \leq 0.1$ and $0 < y \leq 0.1$, respectively, as described in Japanese Patent Provisional Publication No. 59(1984)-47289;

BaFX.xNaX':aEu$^{2+}$, in which each of X and X' is at least one halogen selected from the group consisting of Cl, Br and I; and x and a are numbers satisfying the conditions of $0 < x \leq 2$ and $0 < a \leq 0.2$, respectively, as described in Japanese Patent Provisional Publication No. 59(1984)-56479;

$M^{II}FX.xNaX':yEu^{2+}:zA$, in which $M^{II}$ is at least one alkaline earth metal selected from the group consisting of Ba, Sr and Ca; each of X and X' is at least one halogen selected from the group consisting of Cl, Br and I; A is at least one transition metal selected from the group consisting of V, Cr, Mn, Fe, Co and Ni; and x, y and z are numbers satisfying the conditions of $0 < x \leq 2$, $0 < y \leq 0.2$ and $0 < z \leq 10^{-2}$, respectively, as described in Japanese Patent Provisional Publication No. 59(1984)-56480; and $M^{II}FX.aM^{I}X'.bM'^{II}X''_2.cM^{III}X'''_3.xA:yEu^{2+}$, in which $M^{II}$ *is at least one alkaline earth metal selected from the group consisting of Ba, Sr and Ca*; $M^{I}$ is at least one alkali metal selected from the group consisting of Li, Na, K, Rb and Cs; $M'^{II}$ is at least one divalent metal selected from the group consisting of Be and Mg; $M^{III}$ is at least one trivalent metal selected from the group consisting of Al, Ga, In and Tl; A is at least one metal oxide; X is at least one halogen selected from the group consisting of Cl, Br and I; each of X', X" and X''' is at least one halogen selected from the group consisting of F, Cl, Br and I; a, b and c are numbers satisfying the conditions of $0 \leq a \leq 2$, $0 \leq b \leq 10^{-2}$, $0 \leq c \leq 10^{-2}$ and $a+b+c \geq 10^{-6}$; and x and y are numbers satisfying the conditions of $0 < x \leq 0.5$ and $0 < y \leq 0.2$, respectively, as described in Japanese patent application No. 57(1982)-184455.

The above-described stimulable phosphors are given by no means to restrict the stimulable phosphor employable in the present invention. Any other phosphor can be also employed, provided that the phosphor gives stimulated emission when excited with stimulating rays after exposure to a radiation.

Examples of the binder to be contained in the phosphor layer include: natural polymers such as proteins (e.g. gelatin), polysaccharides (e.g. dextran) and gum arabic; and synthetic polymers such as polyvinyl butyral, polyvinyl acetate, nitrocellulose, ethylcellulose, vinylidene chloride-vinyl chloride copolymer, polymethyl methacrylate, vinyl chloride-vinyl acetate copoymer, polyurethane, cellulose acetate butyrate, polyvinyl alcohol, and linear polyester.

The phosphor layer can be formed on the support, for instance, by the following procedure.

In the first place, phosphor particles and a binder are added to an appropriate solvent such as lower alcohol, ketone, ester or ether, and then they are mixed to prepare a coating dispersion of the phosphor particles in the binder solution.

The ratio between the binder and the phosphor in the coating dispersion may be determined according to the characteristics of the aimed radiation image storage panel and the nature of the phosphor employed. Generally, the ratio therebetween is within the range of from 1:1 to 1:100 (binder:phosphor, by weight), preferably from 1:8 to 1:40.

The coating dispersion may contain a dispersing agent to increase the dispersibility of the phosphor particles therein, and also contain a variety of additives such as a plasticizer for increasing the bonding between the binder and the phosphor particles in the phosphor layer.

The coating dispersion containing the phosphor particles and the binder prepared as described above is applied evenly to the surface of the support to form a layer of the coating dispersion. The coating procedure can be carried out by a conventional method such as a method using a doctor blade, a roll coater or a knife coater. The coating dispersion is then heated slowly to dryness so as to complete the formation of a phosphor layer. The thickness of the phosphor layer varies depending upon the characteristics of the aimed radiation image storage panel, the nature of the phosphor, the ratio between the binder and the phosphor, etc. Generally, the thickness of the phosphor layer is within a range of from 20 $\mu$m to 1 mm, preferably from 50 to 500 $\mu$m.

The phosphor layer can be provided on the support by the methods other than that given in the above. For instance, the phosphor layer is initially prepared on a sheet (false support) such as a glass plate, metal plate or plastic sheet using the aforementioned coating dispersion and then thus prepared phosphor layer is overlaid on the genuine support by pressing or using an adhesive agent.

On the surface of the phosphor layer, a transparent protective film made of such material as aforementioned is provided to protect the phosphor layer from physical and chemical deterioration. The protective film is generally prepared from a transparent cellulose derivative such as cellulose acetate or nitrocellulose; or a transparent systhetic polymer such as polymethyl methacrylate, polyvinyl butyral, polyvinyl formal, polycarbonate, polyvinyl acetate, vinyl chloride-vinyl acetate copolymer, polyethylene terephthalate, polyethylene, polyvinylidene chloride or polyamide. The protective film preferaably has a thickness within the range of approximately 3 to 20 $\mu$m.

However, it is required in the present invention to employ the radiation image storage panel and photosensor in such a combination that the wavelength region of stimulated emission of the phosphor contained in the panel overlaps with the wavelength region of light absorption of the photoconductive material employed in the light receiving section of the photosensitive element of the photosensor. More in detail, it is required to select such a stimulable phosphor and photoconductive material that at least a part of the wavelength region of stimulated emission of the former coincides with at least a part of the wavelength region of absorption of the latter. For example, in the case of employing $\alpha$-Si as the photoconductive material, a stimulable phosphor having an emission wavelength in the vicinity of 600 nm is preferably employed in combination therewith. Otherwise, in the case of employing a divalent europium activated alkaline earth metal fluorohalide phosphor (with a peak wavelength of emission at approximately 390 nm), ZnS and CdS are preferably employed as the photoconductive material.

The other embodiment of the detecting system employable in the method of the present invention is an integrated radiation image detector which has a basic structure comprising a photosensitive member composed of numerous photosensitive elements in regular and two-dimensional arrangement and a phosphor layer provided thereon.

In the photosensitive number, numerous photosensitive elements are arranged regularly and horizontally to form a plane. The same photosensitive element as employed in the above-mentioned photosensor can be employed in the photosensitive member.

The photosensitive member is provided with an insulating layer, and a phosphor layer is provided on the insulating layer. The insulating layer is so made of the light-transmissive insulating material and so desired to have the optical filter function as mentioned above. Otherwise, such a filter layer having the light characteristics as mentioned above may be provided between the insulating layer and the phosphor layer.

The phosphor layer comprising a binder and a stimulable phosphor dispersed therein is formed on the insulating layer (or the filter layer) in the same manner as that of the radiation image storage panel. Alternatively, the phosphor layer can be formed with no binder. For instance, the phosphor layer can be formed on the insulating layer through deposition of the phosphor particles thereon such as vacuum deposition. Further, the transparent protective film as mentioned above is preferably provided on the phosphor layer to protect the phosphor layer from physical shocks and chemical deterioration.

The method of the present invention for detection of a rdiation image using the former detecting system, namely, the combination of the radiation image storage panel and the photosensor will be described, by referring to the partial vertical section views of the panel and photosensor shown in the FIGS. 1-(a) and 1-(b) and a whole circuit diagram of the photosensor shown in FIG. 3.

Figure 1B:
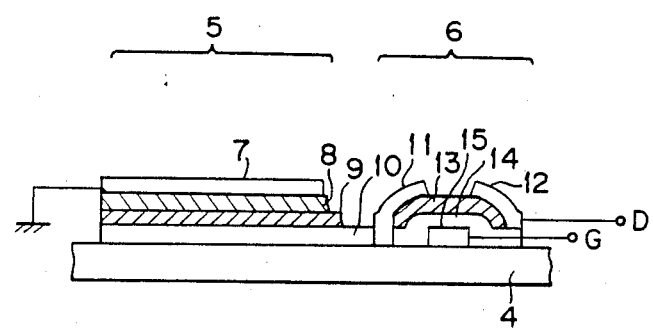

FIG. 1-(a) shows a vertical section view of the radiation image storage panel comprising a protective film 1, a phosphor layer 2 containing a stimulable phosphor and a support 3, superposed in this order.

In the first place, a radiation having passed through an object (or having radiated from an object in the case that the object itself emits a radiation) impinges upon the radiation image storage panel, and is absorbed by the phosphor layer 2 of the radiation image storage panel in proportion to the intensity of the radiation. Thus, a radiation energy-stored image (a kind of latent image) corresponding to the radiation image of the object is formed on the phosphor layer 2.

In the second place, the radiation image storage panel and a photosensor shown in FIG. 1-(b) are so placed together in layers that the protective film 1 of the panel of FIG. 1-(a) and an insulating layer 4 of the photosensor of FIG. 1-(b) are arranged adjacent to each other.

FIG. 1-(b) shows a vertical section view of one pixel (i.e., a photosensitive element) of the photosensor. The photosensitive element comprises a photodiode 5 and MOS:FET (Metal Oxide Semiconductor: Field Effect Transistor) 6, the former serving as a light receiving section and the latter as a transferring section, and both are provided on an insulating layer 4. The insulating layer 4 has the light transmission characteristics that it allows only the light in the wavelength region of the stimulated emission to pass through and cuts off the light in the wavelength region of the stimulating rays. The photodiode 5 comprises a metal layer 7 of aluminum, etc., which serves as an earth, a p-type α-Si:H layer 8, an i-type α-Si:H layer 9, and a transparent electrode layer 10 of tin oxide ($SnO_2$), superposed in this order. The MOS:FET 6 comprises metal layers 11 and 12 of aluminum, etc., which are provided on both sides of an α-Si:H layer 13, the α-Si:H layer 13, an insulating layer 14 of silicon dioxide ($SiO_2$), and a transferring electrode 15 of aluminum, etc., provided in this order. The metal layer 12 serves as a drain and is connected to a transferring resistor. On the other hand, the transferring electrode 15 serves as a gate and is connected to a scanning pulse generator.

Figure 3:
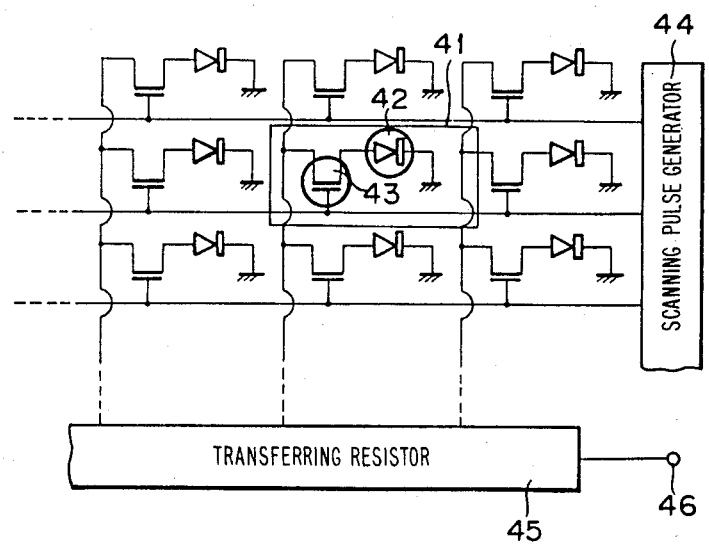
FIG. 3 is a schematic circuit diagram which shows embodiments of the photosensor and radiation image detector of the present invention.

FIG. 3 is a schematic circuit diagram of the photosensor of the present invention. One pixel 41 corresponds to FIG. 1-(b), and consists of a light receiving section 42 and a transferring section 43. Each transferring section in the photosensor is connected to a scanning pulse generator 44 and a transferring resistor 45, individually. On the transferring resistor 45, an output terminal 46 is provided.

In the third place, the radiation image storage panel is irradiated with an electromagnetic wave having a wavelength within the stimulation wavelength region for the stimulable phosphor contained in the panel from the support 3 side shown in FIG. 1-(a). The radiation energy-stored image formed on the phosphor layer 2 is released as stimulated emission, which has an intensity proportional to the intensity of the radiation energy absorbed therein. Subsequently, only the emission released from the panel passes through the insulating layer 4 which serves as the filter for the photosensitive elements and is received by the photodiode 5, shown in FIG. 1-(b). A signal charge corresponding to the intensity of the emission is produced in the photodiode 5. That is, the signal charges proportional to the intensity of the radiation having impinged on the phosphor layer of the panel are produced in every photosensitive element.

When a transferring pulse generated by the scanning pulse generator 44 in the circuit diagram shown in FIG. 3 reaches each photosensitive element in the top row, each of the transferring section on the top row turns to a switch-on state (in FIG. 1-(b), such a state that a given voltage is applied to the transferring electrode 15 and an electric current passes from the metal layer 11 to the metal layer 12). Thus, the signal charge generated in the photodiode 5 in FIG. 1-(b) is transferred via the MOS:-FET 6. Consequently, a signal charge of each photosensitive element in the top row is simultaneously transferred to the transferring resistor 45, and an electric signal corresponding to each pixel is output from the output terminal 46 of the transferring resistor 45.

Thus, the transferring pulse generated by the scanning pulse generator 44 is transferred to each row in the order of from the top to bottom row, and the electric signal produced in each photosensitive element of each row is sequentially output from the output terminal 46.

Subsequently, the output electric signal is amplified in an amplifier and reproduced as an image in an image reproducing apparatus. The obtained electric signal may be subjected to the image processing such as spatial frequency processing, gradation processing, addition averaging processing, reduction processing and enlarging processing, if desired. Thus reproduced image can be recorded on a recording medium, or displayed on a displaying device. Examples of the recording medium include a medium for recording optically by scanning with laser beam on a photosensitive material, or a medium for recording on a heatsensitive recording material using thermic rays. Examples of the image displaying device include a variety of displaying devices based on various systems such as a means for visualizing electrically on CRT, etc., or a means for printing a radiation image displayed on CRT by means of video-printer. Furthermore, the radiation image information on the object may be recorded and stored on a magnetic tape.

Figure 2:
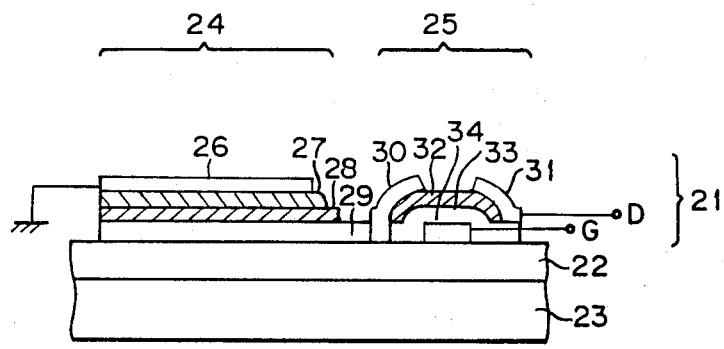
FIG. 2 is a schematic partial section view which shows other embodiment of the radiation image detector according to the present invention.

The method of the present invention for detecting a radiation image can be carried out with the other detecting system, namely, the radiation image detector as shown in FIG. 2.

FIG. 2 shows a vertical section view of one pixel of the radiation image detector comprising the photosensitive member and phosphor layer provided thereon.

In FIG. 2, the radiation image detector is composed of a photosensitive element 21, an insulating layer 22 and a phosphor layer 23, superposed in this order. The photosensitive element 21 comprises a photodiode 24 and MOS:FET 25, the former serving as a light receiving section and the latter as a transferring section. The photodiode 24 comprises a metal layer 26 of aluminum, etc., which serves as an earth, a p-type α-Si:H layer 27, an i-type α-Si:H layer 28, and a transparent electrode layer 29 of tin oxide ($SnO_2$), superposed in this order. The MOS:FET 25 comprises metal layers 30 and 31 of aluminum, etc., which are provided on both sides of an α-Si:H layer 32, the α-Si:H layer 32, an insulating layer 33 of silicon dioxide ($SiO_2$), and a transferring electrode 34 of aluminum, etc., provided in this order. The metal layer 30 serves as a drain and is connected to a transferring resistor. On the other hand, the transferring electrode 34 serves as a gate and is connected to a scanning pulse generator. The insulating layer 22 has the light transmission characteristics that it allows only the light in the wavelength region of the stimulated emission to pass through and cuts off the light in the wavelength region of the stimulating rays.

The photosensitive member composed of the above-mentioned photosensitive elements also has the electric circuit shown in FIG. 3.

The radiation image of an object is detected using the radiation image detector in the same manner as described above, except that it is not needed to place the radiation image storage panel and photosensor together in layers, because the phosphor layer is integrated with the photosensitive member in this system. Accordingly, a radiation having passed through or radiated from the object impinges on the integrated radiation image detector from the phosphor layer-side to be absorbed by the phosphor layer, and when the phosphor layer is irradiated with stimulating rays, the stimulated emission released from the phosphor layer is detected by the photosensitive member integrated therewith.

In the photosensor employed in the present invention, for instance, a photosensitive element having a size (area) of approximately 200 μm×200 μm for a pixel may be employed. For instance, the photosensor may consist of 2150×1750 pixels, if the size of the radiation image storage panel and photosensor are assumed to be identical to a typical radiographic intensifying screen (430 mm×354 mm). As a material of photosensitive element capable of forming such a large and uniform plane, α-Si is preferably employed, and the area of light receiving section of the photosensitive element is preferably as large as possible. For the photosensor of the above-mentioned constitution and size, for example, the pulse generated by the scanning pulse generator preferably has an output of approx. 3 kHz. However, the size of the photosensor and photosensitive element employed in the invention are by no means restricted to the abovementioned size.

The radiation image storage panel and photosensor employable in this combination in the present invention are by no means restricted to the above-mentioned ones (shown in FIG. 1-(a) and in FIGS. 1-(b) and 3, respectively). Any other panel and photosensor having appropriate consitutions can be employed, provided that the panel stores the radiation image of an object as an energy-stored image and then releases it as stimulated emission, and that the photosensor collects the stimulated emission from the panel corresponding to the radiation image.

Further, the radiation image detector employed in the present invention is by no means restricted to one shown in FIGS. 2 and 3, and any other image detector having an appropriate constitution can be employed, provided that the image detector comprises a phosphor layer containing a stimulable phosphor and a photosensitive member composed of numerous photosensitive elements in regular and two-dimensional arrangement for detecting the stimulated emission from the phosphor layer.

Furthermore, the method for detecting a radiation image of the present invention is by no means restricted to the above-mentioned one. For instance, the detection of the radiation image stored in the phosphor layer of the radiation image storage panel (or of the radiation image detector) can be conducted by preliminary operation of irradiating with a weak elecromagnetic wave prior to the above-mentioned operation to measure the intensity of stimulated emission, and thus, the amplification degree of an electric signal to be obtained and the image processing condition can be set based on the result of the preliminary operation.

We claim:

1. A method for detecting radiation image which comprises the steps of:
    causing a radiation image storage panel which comprises a phosphor layer containing a stimulable phosphor to absorb a radiation having passed through an object or radiated from an object;
    providing a photosensor composed of numerous photosensitive elements in regular and two-dimensional arrangement;
    arranging said radiation image storage panel and said photosensor adjacent to each other in the form of layers;
    irradiating the panel with an electromagnetic wave to release the radiation energy stored in the panel as stimulated emission; and
    photoelectrically detecting the stimulated emission with said photosensor.

2. The method for detecting radiation image as claimed in claim 1, in which each photosensitive element comprises a light receiving section and a transferring section, said light receiving section being composed of photodiode and said transferring section being composed of MOS transistor.

3. The method for detecting radiation image as claimed in claim 1, in which the radiation image storage panel comprises a support and a phosphor layer provided thereon which comprises a binder and a stimulable phosphor dispersed therein.

4. The method for detecting radiation image as claimed in any one of claims 1 through 3, in which the stimulable phosphor is a divalent europium activated alkaline earth metal fluorohalide phosphor.

5. A method for detecting radiation image which comprises the steps of:
    causing a phosphor layer of a radiation image detector to absorb a radiation having passed through an object or radiated from an object, said phosphor layer containing a stimulable phosphor, said radiation image detector comprising a photosensitive member composed of numerous photosensitive elements in regular and two-dimensional arrangement, said phosphor layer and said photosensitive member being arranged adjacent to each other;
irradiating said phosphor layer with an electromagnetic wave to release the radiation energy stored in said phosphor layer as stimulated emission; and
photoelectrically detecting the stimulated emission with said photosensitive member.

6. The method for detecting radiation image as claimed in claim 5, in which each photosensitive element comprises a light receiving section and a transferring section, said light receiving section being composed of photodiode and said transferring section being composed of MOS transistor.

7. The method for detecting radiation image as claimed in claim 5 or 6, in which the phosphor layer contains a divalent europium activated alkaline earth metal fluorohalide phosphor.

* * * * *